(12) United States Patent
Raghunath et al.

(10) Patent No.: US 10,503,654 B2
(45) Date of Patent: Dec. 10, 2019

(54) SELECTIVE CACHING OF ERASURE CODED FRAGMENTS IN A DISTRIBUTED STORAGE SYSTEM

(71) Applicant: Intel Corporation, Santa Clara, CA (US)

(72) Inventors: Arun Raghunath, Hillsboro, OR (US); Michael P. Mesnier, Scappoose, OR (US); Yi Zou, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 159 days.

(21) Appl. No.: 15/254,824

(22) Filed: Sep. 1, 2016

(65) Prior Publication Data

US 2018/0060242 A1 Mar. 1, 2018

(51) Int. Cl.
*G06F 12/0888* (2016.01)
*G06F 12/0868* (2016.01)
*G06F 12/121* (2016.01)
*G06F 11/10* (2006.01)
*H03M 13/37* (2006.01)

(52) U.S. Cl.
CPC ...... *G06F 12/0888* (2013.01); *G06F 11/1076* (2013.01); *G06F 12/0868* (2013.01); *G06F 12/121* (2013.01); *H03M 13/3761* (2013.01); *G06F 2212/1032* (2013.01); *G06F 2212/1044* (2013.01); *G06F 2212/403* (2013.01)

(58) Field of Classification Search
CPC .......... G06F 12/0891; G06F 2212/205; G06F 2212/60; G06F 12/0888; G06F 2212/1032; G06F 11/10; G06F 12/0868; G06F 12/121; G06F 2212/1044; G06F 2212/403; G06F 11/1076; H03M 13/154; H03M 13/3761

USPC ........................................................ 711/133
See application file for complete search history.

(56) References Cited

U.S. PATENT DOCUMENTS

| | | | |
|---|---|---|---|
| 5,204,966 | A | 4/1993 | Wittenberg et al. |
| 5,724,552 | A | 3/1998 | Taoda |
| 5,742,792 | A | 4/1998 | Yanai et al. |
| 6,094,486 | A | 7/2000 | Marchant |

(Continued)

FOREIGN PATENT DOCUMENTS

| | | |
|---|---|---|
| CN | 1808411 A | 7/2006 |
| CN | 101120553 A | 2/2008 |

(Continued)

OTHER PUBLICATIONS

Office Action received for U.S. Appl. No. 14/866,892, dated Sep. 26, 2015, 24 pages.

(Continued)

*Primary Examiner* — Hashem Farrokh
(74) *Attorney, Agent, or Firm* — Spectrum IP Law Group LLC (57) ABSTRACT

Methods and apparatus related to framework and/or methodology for selective caching of Erasure Coded fragments in a distributed storage system are described. In one embodiment, a plurality of fragments of a data object are generated. Each of the plurality of fragments is Erasure Coded (EC) prior to storage at a storage node of a plurality of storage nodes. Each of the plurality of fragments is transmitted with a caching hint to indicate whether that fragment is to be cached at the storage node. Other embodiments are also disclosed and claimed.

25 Claims, 7 Drawing Sheets

(56) References Cited

U.S. PATENT DOCUMENTS

| | | | |
|---|---|---|---|
| 6,141,731 A | 10/2000 | Beardsley et al. | |
| 6,223,256 B1 | 4/2001 | Gaither | |
| 6,236,728 B1 | 5/2001 | Marchant | |
| 6,240,183 B1 | 5/2001 | Marchant | |
| 6,658,549 B2 | 12/2003 | Wilson et al. | |
| 6,678,788 B1 | 1/2004 | O'Connell | |
| 6,952,757 B2 | 10/2005 | Carlson et al. | |
| 6,985,974 B1 | 1/2006 | Medina | |
| 7,155,539 B2 | 12/2006 | Vange et al. | |
| 7,167,956 B1 | 1/2007 | Wright et al. | |
| 7,234,063 B1 | 6/2007 | Baugher et al. | |
| 7,237,268 B2 | 6/2007 | Fields | |
| 7,256,790 B2 | 8/2007 | Valmiki et al. | |
| 7,254,837 B2 | 9/2007 | Fields | |
| 7,266,198 B2 | 9/2007 | Medvinsky | |
| 7,266,703 B2 | 9/2007 | Anand et al. | |
| 7,275,103 B1 | 9/2007 | Thrasher et al. | |
| 7,280,536 B2 | 10/2007 | Testardi | |
| 7,308,530 B1 | 12/2007 | Armstrong et al. | |
| 7,461,214 B2 | 12/2008 | Arulambalam et al. | |
| 7,558,850 B2 | 7/2009 | Chambliss et al. | |
| 7,636,801 B1 | 12/2009 | Kekre et al. | |
| 7,721,022 B2 | 5/2010 | Brewer | |
| 7,814,204 B1 | 10/2010 | Wang et al. | |
| 7,970,991 B2 | 6/2011 | Abe | |
| 8,086,711 B2 | 12/2011 | Chambliss et al. | |
| 8,572,622 B2 | 10/2013 | Alexander et al. | |
| 8,706,802 B1 | 4/2014 | Dayan et al. | |
| 9,842,156 B2 | 12/2017 | Mesnier et al. | |
| 2002/0178333 A1 | 11/2002 | Wilson et al. | |
| 2003/0188233 A1 | 10/2003 | Lubbers et al. | |
| 2003/0195940 A1 | 10/2003 | Basu et al. | |
| 2004/0003087 A1 | 1/2004 | Chambliss et al. | |
| 2004/0199566 A1 | 10/2004 | Carlson et al. | |
| 2005/0080992 A1 | 4/2005 | Massey et al. | |
| 2005/0102414 A1 | 5/2005 | Hares et al. | |
| 2005/0154841 A1 | 7/2005 | Sastri et al. | |
| 2006/0112247 A1 | 5/2006 | Ramany et al. | |
| 2006/0143419 A1 | 6/2006 | Tulyani | |
| 2006/0168147 A1 | 7/2006 | Inoue et al. | |
| 2006/0168271 A1 | 7/2006 | Pabari et al. | |
| 2006/0224853 A1 | 10/2006 | Shimazaki et al. | |
| 2006/0236073 A1* | 10/2006 | Soules | G06F 3/0613 711/216 |
| 2006/0253621 A1 | 11/2006 | Brewer et al. | |
| 2006/0272022 A1 | 11/2006 | Loukianov et al. | |
| 2007/0050591 A1 | 3/2007 | Boyd et al. | |
| 2007/0106868 A1 | 5/2007 | Moore et al. | |
| 2007/0113023 A1 | 5/2007 | Arulambalam et al. | |
| 2007/0150322 A1 | 6/2007 | Falchuk et al. | |
| 2007/0177522 A1 | 8/2007 | Okitsu et al. | |
| 2007/0192626 A1 | 8/2007 | Feghali et al. | |
| 2007/0198838 A1 | 8/2007 | Nonaka et al. | |
| 2007/0271391 A1 | 11/2007 | Fujii | |
| 2007/0280277 A1 | 12/2007 | Lund | |
| 2007/0282897 A1 | 12/2007 | Hamilton et al. | |
| 2007/0288752 A1 | 12/2007 | Chan | |
| 2008/0016297 A1 | 1/2008 | Bartley et al. | |
| 2008/0016308 A1 | 1/2008 | Bartley et al. | |
| 2008/0016310 A1 | 1/2008 | Ghosal et al. | |
| 2008/0046269 A1 | 2/2008 | Lopez | |
| 2008/0086609 A1 | 4/2008 | Lesser et al. | |
| 2008/0091644 A1 | 4/2008 | Vedula | |
| 2008/0133767 A1 | 6/2008 | Birrer et al. | |
| 2008/0177951 A1 | 7/2008 | Bartley et al. | |
| 2008/0222311 A1 | 9/2008 | Lee et al. | |
| 2009/0006593 A1 | 1/2009 | Cortes | |
| 2009/0028339 A1 | 1/2009 | Goodman et al. | |
| 2009/0055593 A1 | 2/2009 | Satoyama et al. | |
| 2009/0144632 A1 | 6/2009 | Mendez | |
| 2009/0177895 A1 | 7/2009 | Murayama et al. | |
| 2009/0234805 A1 | 9/2009 | Golwalkar et al. | |
| 2009/0271543 A1 | 10/2009 | Brewer et al. | |
| 2010/0077107 A1 | 3/2010 | Lee et al. | |
| 2010/0169570 A1 | 7/2010 | Mesnier et al. | |
| 2010/0318632 A1 | 12/2010 | Yoo et al. | |
| 2010/0332532 A1 | 12/2010 | Joshi et al. | |
| 2011/0066668 A1 | 3/2011 | Guarraci | |
| 2011/0161976 A1 | 6/2011 | Alexander et al. | |
| 2011/0295948 A1 | 12/2011 | Rao et al. | |
| 2011/0314182 A1 | 12/2011 | Muppirala et al. | |
| 2012/0096281 A1 | 4/2012 | Eszenyi et al. | |
| 2012/0166611 A1 | 6/2012 | Kim et al. | |
| 2012/0284229 A1 | 11/2012 | Kim et al. | |
| 2012/0290786 A1 | 11/2012 | Mesnier | |
| 2012/0311138 A1 | 12/2012 | Inamdar et al. | |
| 2013/0232310 A1 | 9/2013 | Kruus | |
| 2014/0089735 A1 | 3/2014 | Barrett et al. | |
| 2014/0119221 A1 | 5/2014 | Park et al. | |
| 2014/0122489 A1 | 5/2014 | Mesnier et al. | |
| 2014/0149537 A1 | 5/2014 | Shankaran et al. | |
| 2014/0164549 A1* | 6/2014 | Cudak | G06F 17/30 709/213 |
| 2014/0207928 A1 | 7/2014 | Mesnier et al. | |
| 2014/0325260 A1* | 10/2014 | Gladwin | G06F 11/1092 714/6.13 |
| 2014/0330802 A1 | 11/2014 | Preslan et al. | |
| 2014/0379921 A1 | 12/2014 | Morley et al. | |
| 2015/0039792 A1 | 2/2015 | Spry | |
| 2015/0043347 A1 | 2/2015 | Ng et al. | |
| 2015/0134825 A1 | 5/2015 | Alshinnawi et al. | |
| 2015/0149663 A1 | 5/2015 | Weihs | |
| 2015/0201033 A1* | 7/2015 | Gupta | H04L 67/2842 709/213 |
| 2015/0268868 A1 | 9/2015 | Li-on et al. | |
| 2015/0269239 A1 | 9/2015 | Swift et al. | |
| 2015/0277969 A1 | 10/2015 | Strauss et al. | |
| 2015/0293830 A1 | 10/2015 | Bhide et al. | |
| 2016/0011816 A1* | 1/2016 | Aizman | G06F 3/0604 711/117 |
| 2016/0094649 A1 | 3/2016 | Dornquast et al. | |
| 2016/0314043 A1* | 10/2016 | Slik | G06F 11/1076 |
| 2016/0314188 A1 | 10/2016 | Mesnier et al. | |
| 2016/0378846 A1 | 12/2016 | Luse et al. | |
| 2017/0093975 A1 | 3/2017 | Raghunath et al. | |
| 2017/0093976 A1 | 3/2017 | Raghunath et al. | |
| 2017/0249213 A1* | 8/2017 | Slik | G06F 11/1092 |
| 2017/0251073 A1 | 8/2017 | Raghunath et al. | |

FOREIGN PATENT DOCUMENTS

| | | |
|---|---|---|
| CN | 102301355 A | 12/2011 |
| DE | 112011106066 T5 | 10/2014 |
| EP | 2382550 A1 | 11/2011 |
| WO | 03/027856 | 4/2003 |
| WO | 2006/119446 | 11/2006 |
| WO | 2010/078161 A2 | 7/2010 |
| WO | 2010/078161 A3 | 9/2010 |
| WO | 2013/101037 A1 | 4/2013 |
| WO | 2013/101041 A1 | 7/2013 |
| WO | 2013/184935 A1 | 12/2013 |
| WO | 2015/016907 A1 | 2/2015 |
| WO | 2017/052991 A1 | 3/2017 |
| WO | 2017/052992 A1 | 3/2017 |
| WO | 2017/151250 A1 | 8/2017 |

OTHER PUBLICATIONS

International Search Report and Written Opinion received for International Application No. PCT/US2016/048849, dated Nov. 30, 2016, 7 pages.

Office Action received for U.S. Appl. No. 14/866,893, dated Sep. 25, 2017, 23 pages.

International Search Report and Written Opinion received for International Application No. PCT/US2016/048850, dated Nov. 24, 2016, 11 pages.

Office Action received for U.S. Appl. No. 13/993,374, dated Nov. 24, 2016, 13 pages.

Office Action received for U.S. Appl. No. 13/993,374, dated Jun. 16, 2016, 12 pages.

Office Action received for U.S. Appl. No. 13/993,374, dated Oct. 23, 2015, 13 pages.

(56) References Cited

OTHER PUBLICATIONS

Office Action received for U.S. Appl. No. 13/993,374, dated May 11, 2015, 11 pages.
Office Action received for Chinese Patent Application No. 201180076124.2, dated Feb. 7, 2018, 20 pages including 11 pages of English translation.
Office Action received for Chinese Patent Application No. 201180076124.2, dated Mar. 2, 2016, 16 pages icluding 8 pages of English translation.
Office Action received for Chinese Patent Application No. 201180076124.2, dated Oct. 17, 2016, 19 pages including 10 pages of English translation.
International Search Report and Written Opinion received for International Application No. PCT/US2011/067808, dated Aug. 28, 2012, 7 pages.
Notice of Allowance Received for U.S. Appl. No. 13/993,357, dated Jul. 28, 2017, 8 pages.
Office Action received for U.S. Appl. No. 13/993,357, dated Mar. 13, 2017, 14 pages.
Office Action received for U.S. Appl. No. 13/993,357, dated Dec. 17, 2015, 14 pages.
Office Action received for U.S. Appl. No. 13/993,357, dated Jul. 7, 2015, 15 pages.
Office Action received for U.S. Appl. No. 15/198,881, dated Nov. 4, 2016, 15 pages.
International Search Report and Written Opinion received for International Application No. PCT/US2011/067788, dated May 29, 2012, 6 pages.
Office Action received for U.S. Appl. No. 15/198,881, dated Aug. 3, 2017, 17 pages.
Office Action received for U.S. Appl. No. 15/198,881, dated Feb. 26, 2018, 17 pages.
Office Action received for U.S. Appl. No. 12/319,012, dated Dec. 5, 2013, 33 pages.
Office Action received for U.S. Appl. No. 12/319,012, dated Jun. 12, 2013, 25 pages.
Office Action received for U.S. Appl. No. 12/319,012, dated Mar. 20, 2013, 31 pages.
Office Action received for U.S. Appl. No. 12/319,012, dated Dec. 7, 2012, 29 pages.
Office Action received for U.S. Appl. No. 12/319,012, dated Sep. 11, 2012, 30 pages.
Office Action received for U.S. Appl. No. 12/319,012, dated May 8, 2012, 21 pages.
Office Action received for U.S. Appl. No. 12/319,012, dated Apr. 4, 2012, 20 pages.
Office Action received for U.S. Appl. No. 12/319,012, dated Dec. 8, 2011, 20 pages.
Rockaway, "Advantages and Disadvantages of solid State Disk Drives Over," Dec. 6, 2007, pp. 1-7, http://aceshardware.freeforurns.org/advantages-and-disadvantages-of-solid-state-disk-drives-over-t309.html.
Supplementary European Search Report for European Application No. 09837017, dated Dec. 14, 2012, 5 pages.
Webopedia, "Operating System," Jun. 19, 2000, pp. 1-3, retrieved from http://web.archive.org/web/20000619030201/http://www.webopedia.com/TERM/o/operating_system.html.
Andreas Klein, "Attacks on the RC4 Stream Cipher," Jul. 4, 2007, pp. 1-22, http://cage.urgent.be/~klein/papers/RC4-en.pdf?bcsi-ac-2160f1cfec399f=IDFA724000001021Wf46E4f4tebEUHPQSJcaqnM74DgDQAAAgEAAKwbNACEAwAAAAAAAKjLDgA=.
Kevin Day, "Understanding Encryption and Password Protection," 2006, pp. 1-3, http://www.attachplus.como/mkt/docs/understanding_encryption_and_password_protection.pdf.
Wikipedia, "Triple DES," Apr. 25, 2012, pp. 1-5, http://en.wikipedia.org/wiki/3des.
Webopedia, "RAID," Oct. 30, 2001, pp. 1-2, http://web.archive.org/web/20020810160046/http://www.webopedia.com/TERM/R/RAID.html.
Carol Bailey, "Introducing: Out of Band Management in Configuration Manager 2007 SP1," Jan. 21, 2008, pp. 1-4 http://blogs.technet.com/b/wemd_ua_-_sms_writing_team/archive/2008/01/21/introducing-out-of-band-management-in-configuration-manager-2007-sp1.aspx.
Team NIB, "Chapter 13. The Block I/O Layer," p. 1; http:www.makelinux.net/books/lkd2/ch13.
International Search Report and Written Opinion received for PCT Patent Application No. PCT/US2009/069265, dated Jul. 29, 2010, 8 pages.
Office Action received for U.S. Appl. No. 13/336,411, dated Jan. 22, 2013, 26 pages.
Office Action received for U.S. Appl. No. 13/336,411, dated Aug. 27, 2012, 24 pages.
Office Action received for U.S. Appl. No. 13/336,411, dated May 23, 2012, 26 pages.
Office Action received for U.S. Appl. No. 13/336,411, dated Jan. 30, 2012, 19 pages.
Mesnier, et al. "Differentiated Storage Services," 23rd ACM Symposium on Operating System Principles (SOSP), Oct. 23-26, 2011, Cascais, Portugal, 14 pages.
Wikipedia, "Opal Storage Specification," http://en.wikipedia.org/wiki/Opal_Storage_Specification, retrieved Dec. 22, 2011.
Office Action received for Chinese Patent Application No. 200980155568.8 dated Apr. 23, 2014, 30 pages including 13 pages of English translation.
Office Action received for Chinese Patent Application No. 200980155568.8 dated Oct. 31, 2014, 30 pages including 13 pages of English translation.
Notice of Allowance received for Chinese Patent Application No. 200980155568.8, dated Nov. 16, 2015, 4 pages including 2 pages of English translation.
Office Action received for U.S. Appl. No. 13/105,333, dated Aug. 22, 2013, 22 pages.
Office Action received for U.S. Appl. No. 13/105,333, dated Mar. 27, 2013, 16 pages.
International Search Report and Written Opinion received for International Application No. PCT/US2017/015243, dated Apr. 28, 2017, 7 pages.

* cited by examiner

SELECTIVE CACHING OF ERASURE CODED FRAGMENTS IN A DISTRIBUTED STORAGE SYSTEM

FIELD

The present disclosure generally relates to the field of electronics. More particularly, some embodiments generally relate to framework and/or methodology for selective caching of Erasure Coded (EC) fragments in a distributed storage system.

BACKGROUND

Generally, Erasure coding (EC) is a method of data protection in which data is split into fragments, expanded, and encoded with redundant data pieces and stored across a set of different storage nodes or storage media.

Moreover, EC is similar to RAID (Redundant Array of Inexpensive Drives) in that parity fragments are created and stored along with data fragments. In the event of a storage device failure, lost data fragments can be reconstructed from the remaining data and parity fragments. However, some current EC implementations can be inefficient.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

EC is generally implemented as a "k-of-n" scheme, where user data is decomposed into k data fragments and m parity fragments. When accessing data, any k of the n=k+m total fragments need to be accessible, otherwise data is lost. In other words, in a k-of-n scheme, a system can suffer up to m device failures. This makes EC very well suited to distributed storage systems, such as Ceph™ and Swift™, where there are multiple backend storage nodes (any of which can fail).

However, EC creates a complication for any caching solution in the backend storage nodes, since any given node will only see a fragment of the object data. In order to retrieve the data to service a GET (i.e., read) request, the minimal subset of fragments (e.g., from k of the n backend storage nodes) are retrieved. Consequently, the retrieval of the data is gated by the slowest responder amongst the minimal fragment subset. This implies that caching a fragment in a particular node will not provide any benefit unless each node holding the other fragments also caches its respective fragment. There is little benefit to caching only a subset of the fragments. Ideally, all n nodes should agree whether to cache the data (and parity) fragments for a given object. However, for this to occur, the backend storage nodes need to possess cluster-level information; namely, the caching policy for each fragment stored by the storage nodes.

Some embodiments relate to framework and/or methodology for selective caching of Erasure Coded (EC) fragments in a distributed storage system. Moreover, existing backend storage node caching solutions may operate in isolation and fail to leverage any cluster-level context, making them ineffective for caching when EC is used. To this end, one or more embodiments enable effective caching in an EC distributed data store via a framework and methodology to coordinate caching of fragments across the storage system cluster. For example, caching "hints" (which may include one or more bits of data) may be sent to storage nodes of the cluster in order to inform them of the caching policy of their EC fragments. In an embodiment, logic (e.g., logic 160 shown in the figures) is able to select whether to cache EC fragments in a distributed storage system. Also, while logic 160 is illustrated in various locations in the figures, embodiments are not limited to the locations shown and logic 160 may be provided in other locations.

Figure 4:
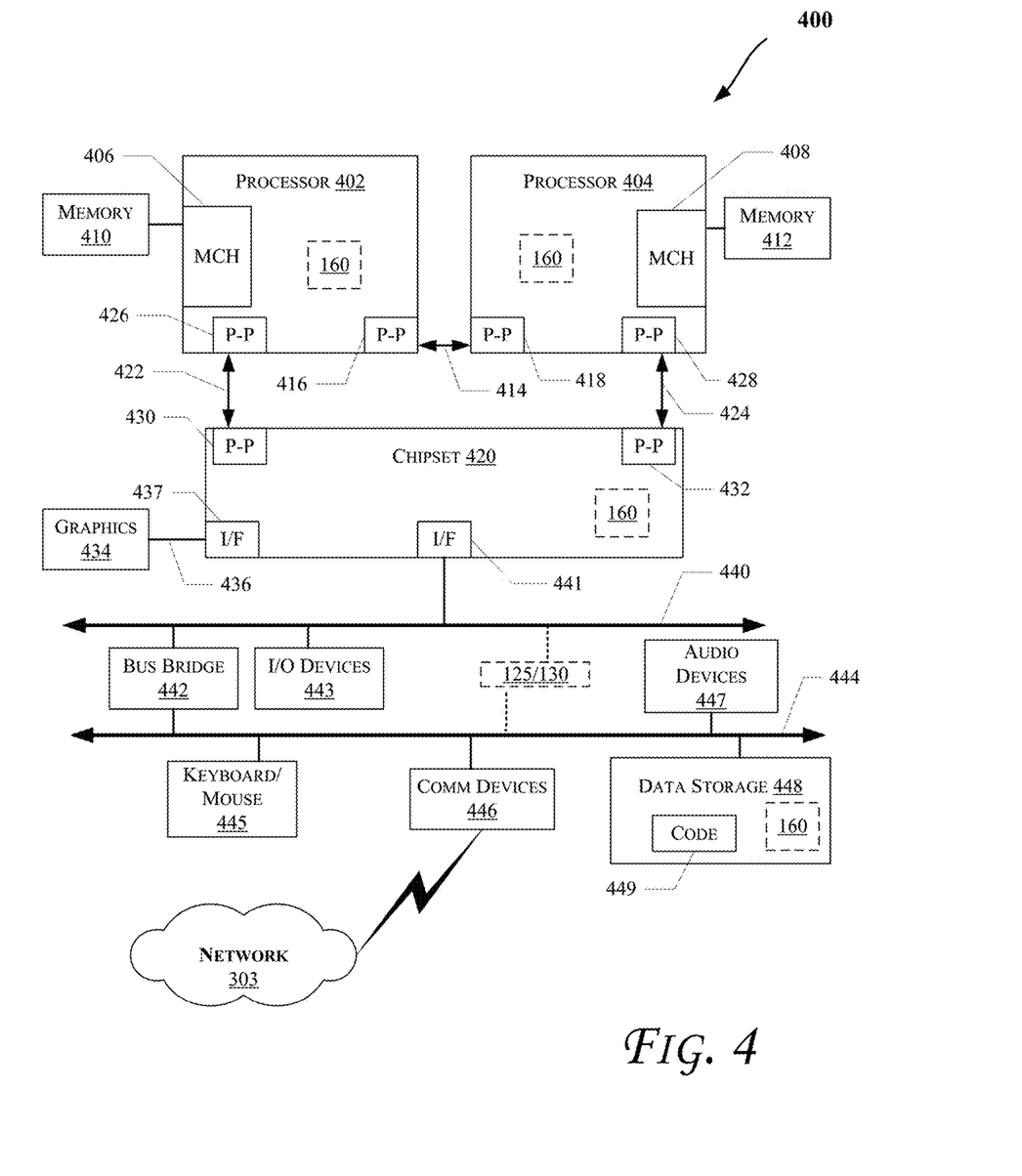
Figure 5:
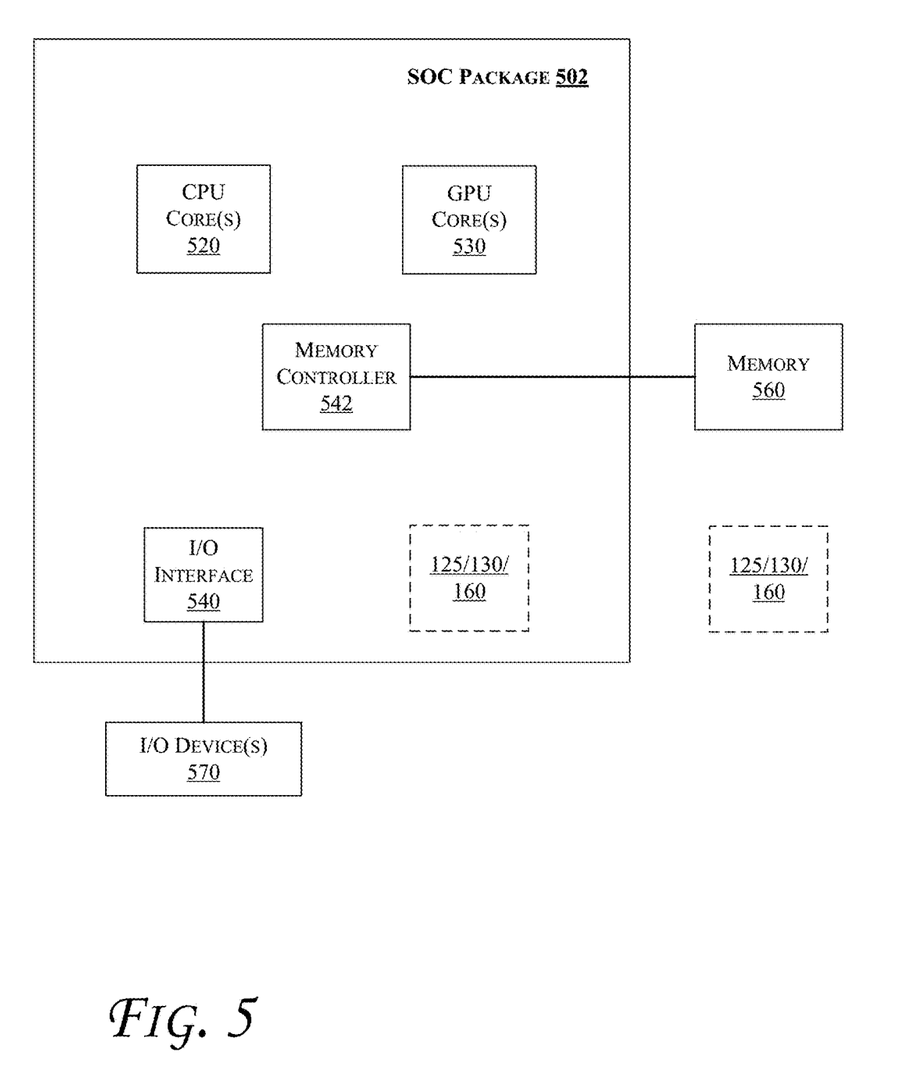

As discussed herein, object store (or object storage) generally refers to a storage architecture that manages data as objects, e.g., as opposed to storage architectures such as file systems (that manage data as a file hierarchy) or block storage (which manages data as blocks). Object storage systems allow relatively inexpensive, scalable and self-healing retention of massive amounts of unstructured data. The object stores may be distributed at various near and/or far storage nodes or storage devices Additionally, as discussed herein, a far (or remote) node generally refers to a node that is reachable over a network link (or even across one or more network switches or hubs), whereas a near node may be reached over a local communication channel or interconnect (such as those discussed herein with reference to FIGS. 3, 4, and/or 5, e.g., including a Peripheral Component Interconnect (PCI), PCI express (PCIe), etc.). Also, a node generally refers to a computing device (e.g., including a storage device or memory).

Furthermore, one or more embodiments discussed herein may be applied to any type of memory including Volatile Memory (VM) and/or Non-Volatile Memory (NVM). Also, embodiments are not limited to a single type of NVM and non-volatile memory of any type or combinations of different NVM types (e.g., including NAND and/or NOR type of memory cells) or other formats usable for memory) may be used. The memory media (whether used in DIMM (Dual Inline Memory Module) format or otherwise) can be any type of memory media including, for example, one or more of: nanowire memory, Ferro-electric Transistor Random Access Memory (FeTRAM), Magnetoresistive Random Access Memory (MRAM), multi-threshold level NAND flash memory, NOR flash memory, Spin Torque Transfer Random Access Memory (STTRAM), Resistive Random Access Memory, byte addressable 3-Dimensional Cross Point Memory, single or multi-level PCM (Phase Change Memory), memory devices that use chalcogenide phase change material (e.g., chalcogenide glass) or "write in place" non-volatile memory. Also, any type of Random Access Memory (RAM) such as Dynamic RAM (DRAM), backed by a power reserve (such as a battery or capacitance) to retain the data, may provide an NV memory solution. Volatile memory can include Synchronous DRAM (SDRAM). Hence, even volatile memory capable of retaining data during power failure or power disruption(s) may be used for memory in various embodiments.

Figure 1:
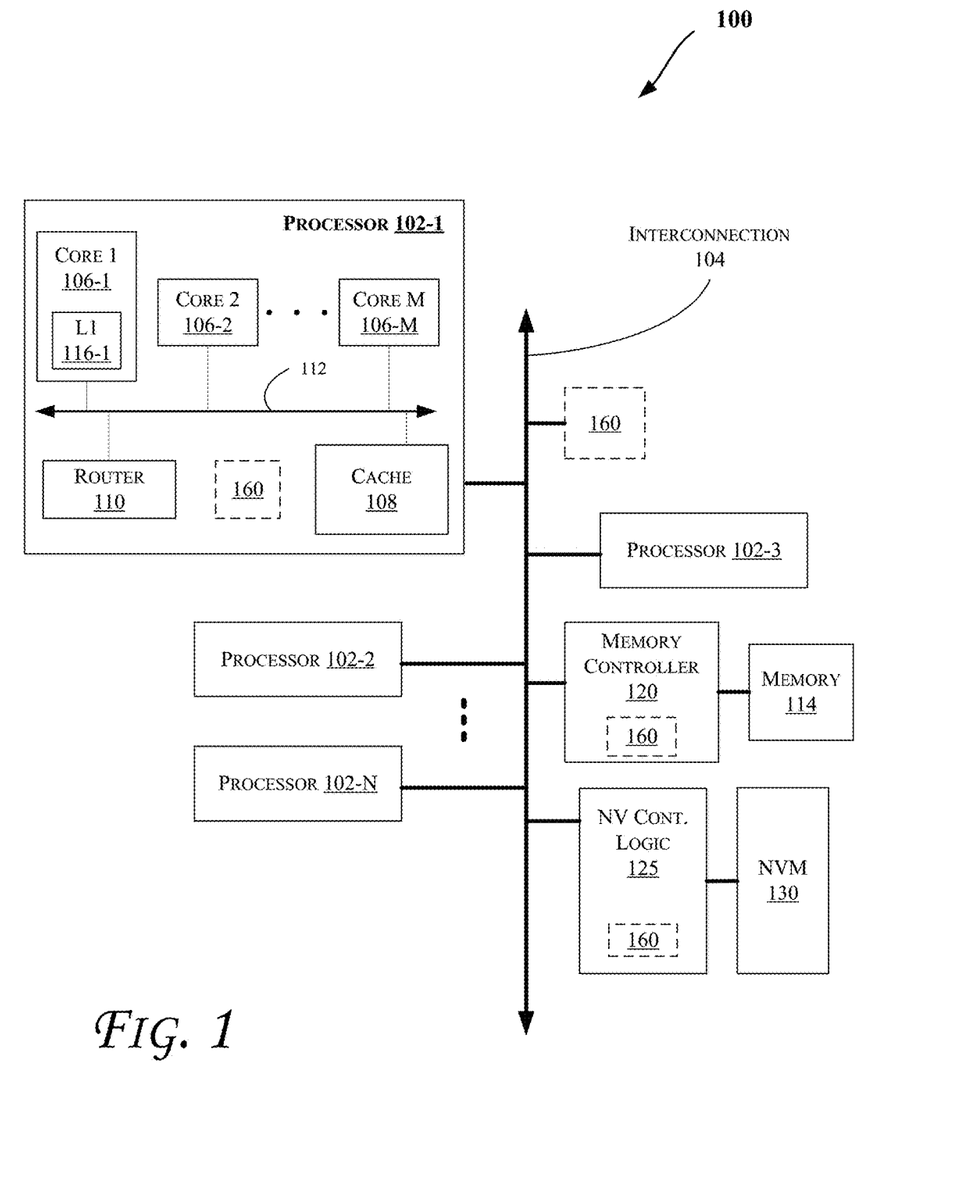
FIGS. 1, 3, 4, and 5 illustrate block diagrams of embodiments of computing systems, which may be utilized to implement various embodiments discussed herein.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-5. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a processor cache 108 (which may be a shared cache or a private cache in various embodiments), and/or a router 110. The processor cores 106 may be implemented on a single integrated circuit (IC) chip. Moreover, the chip may include one or more shared and/or private caches (such as processor cache 108), buses or interconnections (such as a bus or interconnection 112), logic 120, memory controllers (such as those discussed with reference to FIGS. 3-5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The processor cache 108 may store data (e.g., including instructions) that are utilized by one or more components of the processor 102-1, such as the cores 106. For example, the processor cache 108 may locally cache data stored in a memory 114 for faster access by the components of the processor 102. As shown in FIG. 1, the memory 114 may be in communication with the processors 102 via the interconnection 104. In an embodiment, the processor cache 108 (that may be shared) may have various levels, for example, the processor cache 108 may be a mid-level cache and/or a last-level cache (LLC). Also, each of the cores 106 may include a level 1 (L1) processor cache (116-1) (generally referred to herein as "L1 processor cache 116"). Various components of the processor 102-1 may communicate with the processor cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 also includes NV memory 130 (or Non-Volatile Memory (NVM), e.g., compliant with NVMe (NVM express)) coupled to the interconnect 104 via NV controller logic 125. Hence, logic 125 may control access by various components of system 100 to the NVM 130. Furthermore, even though logic 125 is shown to be directly coupled to the interconnection 104 in FIG. 1, logic 125 may communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 3, 4, and/or 5), etc.). Additionally, logic 125 may be incorporated into memory controller logic (such as those discussed with reference to FIGS. 3-5) or provided on a same Integrated Circuit (IC) device in various embodiments (e.g., on the same IC device as the NVM 130 or in the same enclosure as the NVM 130). System 100 may also include other types of non-volatile memory such as those discussed with reference to FIGS. 3-5, including for example a hard drive, etc.

Some embodiments use cluster-level context to coordinate caching amongst storage cluster nodes that hold fragments of a given piece of data. The consistency processes and existing communication paths in the distributed store may be used to pass caching hints from entities possessing cluster level state to the backend storage node where the fragments are stored. These entities may be referred to as proxy nodes (in Swift™ object stores) or gateway nodes (in Ceph™ object stores). Specifically, a proxy or gateway node is aware of each object being stored, understands how objects are decomposed into EC fragments, and/or can communicate the caching policy of these fragments to the backend storage nodes. Based on the above principles, one or more embodiments utilize a few different coordination schemes including: (1) when sending fragments of data to different nodes, a hint is also sent to each node in the cluster whether to cache (or not cache) the respective fragment (e.g., cache all fragments or none); and/or (2) when a node evicts a fragment from its cache, that node transmits the eviction information to the other nodes holding fragments of the original data (e.g., evict all when evicting one). Alternatively, the evicting node could report the eviction to logic 160 for communication to other nodes holding fragments of the original data object.

By contrast, current distributed stores fail to make any attempt to coordinate amongst different storage nodes when it comes to caching of EC fragments. While prior work may have used technology within each backend storage node to direct the storage traffic appropriately between storage devices to improve performance, it uses context available locally (metadata vs data, size of the data) to determine where the data should be directed. Such techniques do not work in an erasure coded store where each node only receives a fragment of the entire data uploaded in a request and, as a consequence, every fragment may be of the same size. Techniques that only rely on information at the backend storage node do not have sufficient cluster-level context to recognize that certain fragments are part of the same data. Without this context, as mentioned, caching only some of the fragments will not typically provide improved performance.

Furthermore, distributed stores may implement EC in a manner that is transparent to the end user accessing objects. The storage system uploads and downloads complete objects with one of the components of the distributed system (like the Swift proxy) responsible for "sharding" an uploaded object into EC fragments or reassembling fragments into complete objects to return to the end user. Generally, sharding is a type of data partitioning that separates data into smaller, more easily managed parts called data shards. The word shard means a small part of a whole. An embodiment utilizes this architecture to generate caching hints at a cluster-level entity responsible for creating the object fragments or shards as shown in FIG. 2A.

Figure 2A:
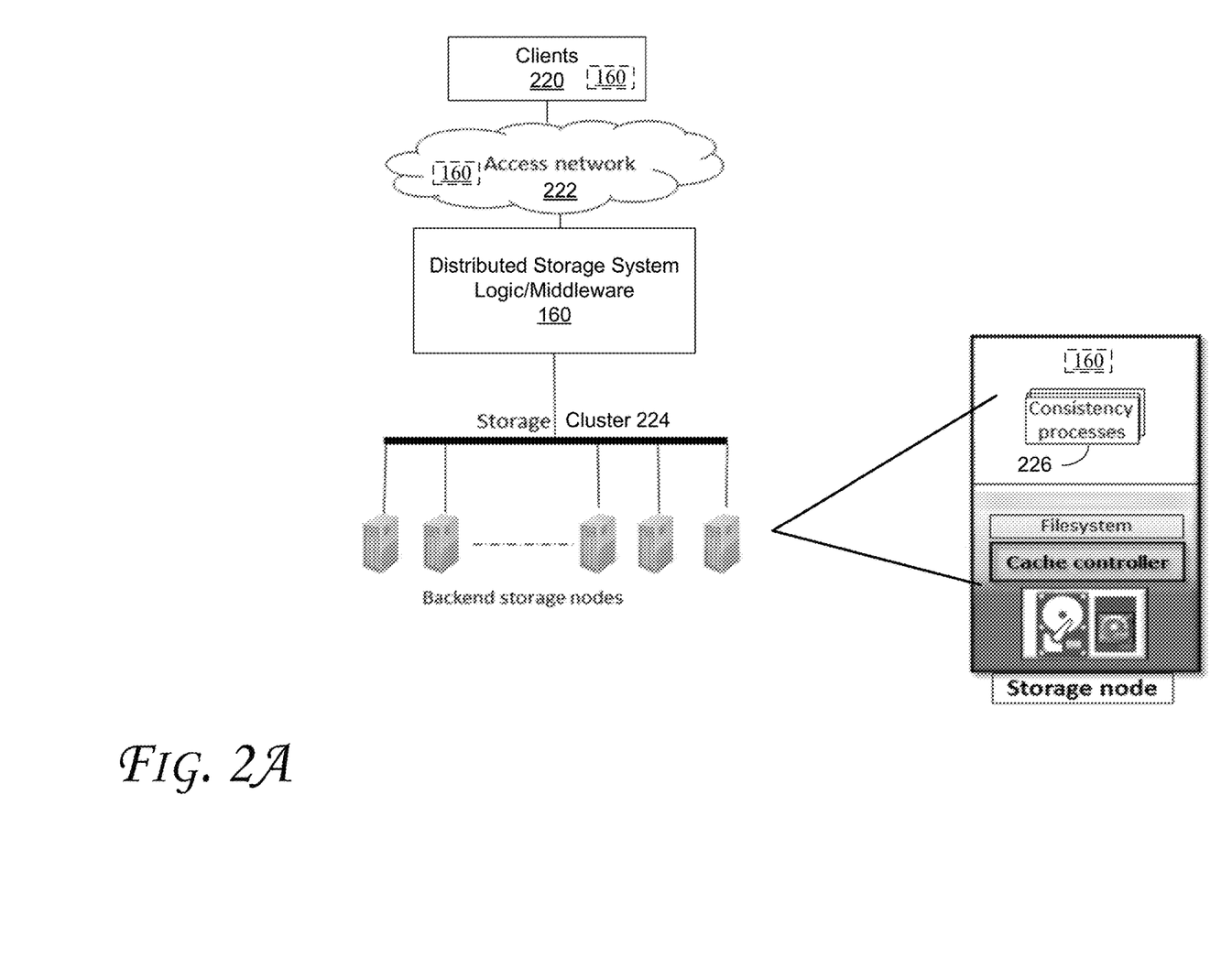
FIG. 2A illustrates a block diagram of a storage system to provide coordinated Erasure Coded (EC) caching, according to an embodiment.
Figure 2B:
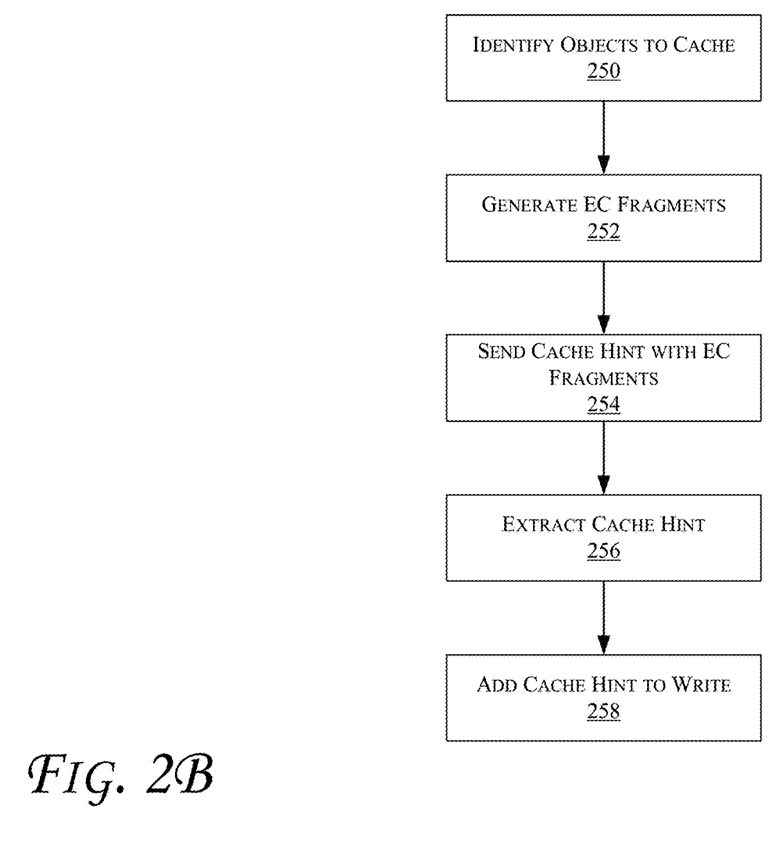
FIG. 2B illustrates a flow diagram for selective caching of EC fragments in a distributed storage system, according to an embodiment.

More particularly, FIG. 2A illustrates a block diagram of a storage system to provide coordinated EC caching, according to an embodiment. The system (e.g., through logic 160) may provide support for caching of all fragments of a data object (or more generally a piece of data) or none. FIG. 2B illustrates a flow diagram for selective caching of EC fragments in a distributed storage system, according to an embodiment.

Referring to FIGS. 2A and 2B, clients 220 may communicate through an access network 222 (which could be a wired or wireless network such as network 303 discussed with reference to FIGS. 3 and/or 4) with storage cluster (or network) 224 via distributed storage system logic or middleware 160. Location of logic 160 is not limited to being between the storage cluster 224 and clients 220, and in various embodiments logic 160 may be located in locations shown in FIG. 2A, as well as locations not shown, as long as logic 160 performs its operations as described herein. In one embodiment, a policy driven framework is defined for logic 160 to choose which object's fragments should be cached 250, e.g., based on object size, object source, object destination, etc.

For example, an operator or user may specify a size-range based policy to cache all the fragments of objects whose size falls in specified ranges. Another example policy could be to cache all fragments of objects uploaded by a specific source/user or for a specific destination. Once an object has been erasure coded, the appropriate cache hint is generated 252 by the storage middleware (or logic 160) when sending an individual fragment to the chosen backend storage nodes 254. In an embodiment, the storage middleware may be implemented in a server (which may be referred to as the "proxy" or "gateway" in a distributed storage system) since the process of creating EC fragments is generally transparent to the client. If the policy dictates that an object be cached, a hint to cache the fragments of the object are sent along with each fragment to the storage cluster (or network) 224 (which may be implemented via a network of servers in an embodiment, e.g., where the network of servers may communicate via a computer network (such as those discussed herein with reference to FIGS. 3 and/or 4), including one or more types of network connections such as Ethernet, fiber optics, etc.). Conversely, if an object is not to be cached, hints to ensure none of the fragments are cached are sent (or alternatively no hints are sent at all). The cache hints are then extracted 256 at the backend storage nodes of the storage network and the hints are added to (e.g., file system) write operation 258. In an embodiment, the cache/caching hint may also be used by a receiving storage node to determine where to store an EC fragment in the storage hierarchy of the storage node (or other backend nodes coupled to the receiving node). For example, in one embodiment, the receiving storage node could examine if an incoming EC fragment includes a hint, and if it does, store it in a faster tier in the storage hierarchy. Moreover, to form the storage hierarchy, the backend storage servers may have multiple different storage mediums (e.g., SSD, HDD, etc.) with different characteristics that are organized as tiers. For instance, the slowest storage medium may be the largest in size. A subset of the data stored in the slowest tier(s) could also be stored in the faster tier(s). All these operations may occur transparently to the user of the storage hierarchy. Hence, one goal is to keep data that is most relevant stored in the faster storage mediums. In another embodiment, the incoming hint could be used as an indication that the receiving node apply its local storage policy to choose the appropriate storage tier (whereas EC fragments with no hint may bypass the faster tiers entirely and be placed in the slowest tier without consulting the local storage policy).

As shown in FIG. 2A, the backend storage nodes may include a storage server (and/or other types of storage devices). The storage node may include one or more consistency processes 226 to ensure consistency of data stored, e.g., by passing an eviction hint from the object storage node to its (e.g., closest one or more (or two)) neighbors. The eviction process may repeat until all of the fragments for the given object are evicted. The storage node may also include a file system, cache controller (e.g., to cache or evict fragments per the cache hint), and/or one or more storage devices (such as a Hard Disk Drive (HDD), a Solid State Drive (SSD), combinations thereof (e.g., a hybrid drive with both an SSD and an HDD), any other non-volatile memory (such as those discussed herein)). Hence, as discussed herein, a node may include a server as well as one or more storage devices. The SSD portion of the storage node may be used for general data storage and/or caching of EC fragments in some embodiments. Also, the caching hints discussed herein may be used for both object read and write operations. Furthermore, in cases where there is limited cache space, some object fragments may still get evicted (even if they had a hint to cache on WRITE). In cases such as these, a subsequent READ can carry a hint that the fragments should be "read allocated in the cache" if they are not already there.

Figure 2C:
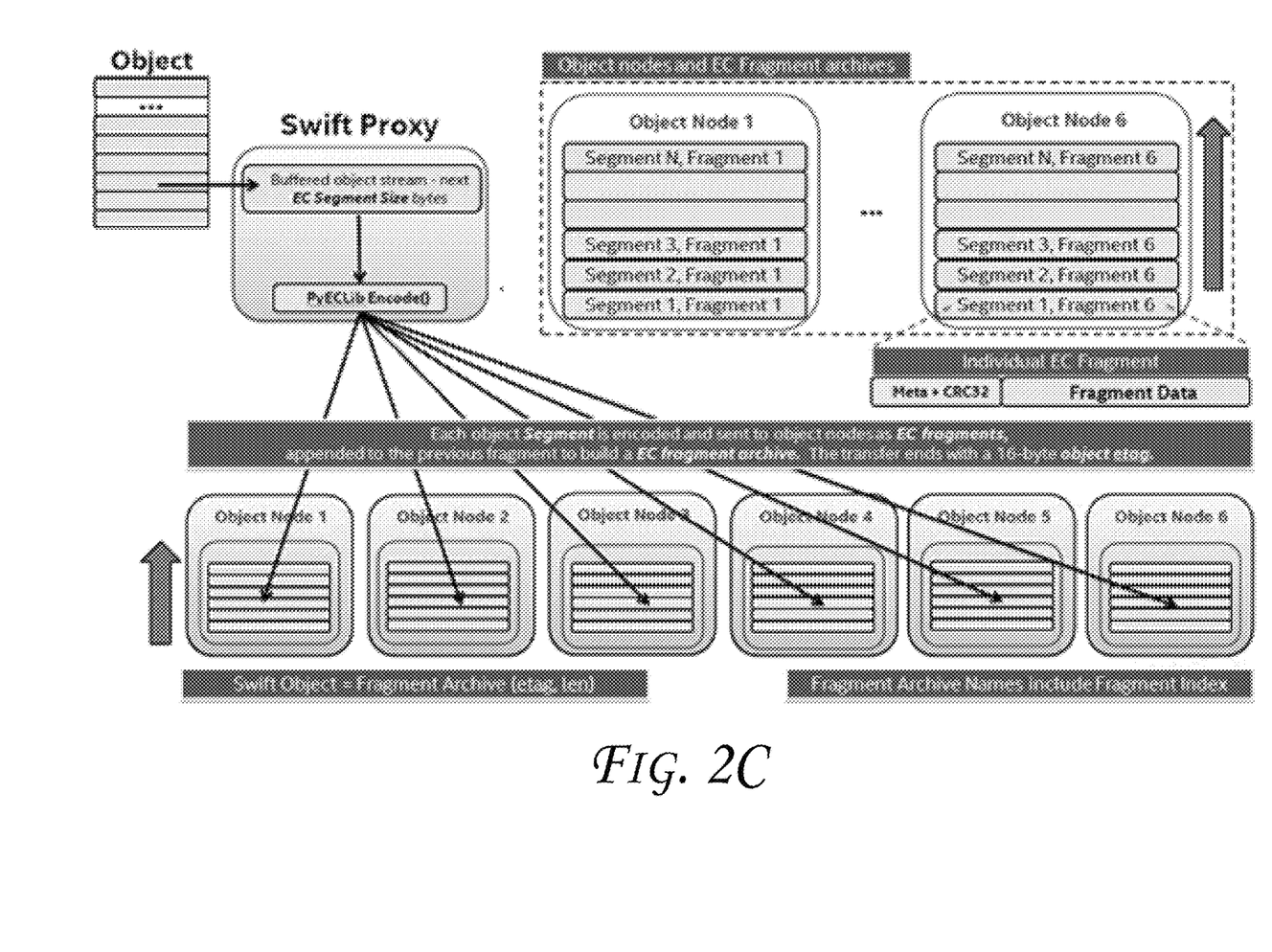
FIG. 2C illustrates an object storage system utilizing EC fragments, according to an embodiment.

FIG. 2C illustrates an object storage system utilizing EC fragments, according to an embodiment. The example of FIG. 2C highlights how the EC fragment handling may be performed in a distributed object store like Swift, but embodiments are not limited to Swift and other object stores may be utilized. As shown, individual EC fragments may include metadata, CRC (Cyclical Redundancy Code), and fragment data. Each object segment is encoded and sent to object nodes as EC fragments. The EC fragments may be appended to the previous fragment to build an EC fragment archive at object nodes. In an embodiment, the EC fragment transfer may end with an object etag (or entity tag, which is an opaque identifier assigned to a specific version of the object at the given URL (Uniform Resource Locator)) (which may be 16 bytes long in at least one embodiment) and a content length ("len") which captures the length of the original object before fragmenting. Moreover, the fragment archive names may include a fragment index.

In one embodiment, the caching hints are added to the messages exchanged between the storage system components. For example, in Swift, the communication between the proxy and the object servers takes place via HTTP (HyperText Transfer Protocol) verbs. One embodiment extends the proxy to pass a hint using an HTTP header along with the HTTP verb for a given request, to indicate that the fragment be cached. An object server (or logic such as 160) in the backend storage node may extract this hint and pass the hint to the cache controller. In the case of Ceph, message header extensions to the Ceph protocol can be used to pass the cache hints between the Ceph gateway and the backend Object Storage Daemon (OSD). In an embodiment, HTTP messages are sent between a proxy and backend storage nodes. The body of the message may contain the fragment. The headers of the message may be extended to carry the hint.

In one embodiment, when an object fragment is evicted from a backend node, the eviction may be coordinated from (e.g., every) other node(s) holding a fragment of the related object. One embodiment of this coordination for Swift involves the backend node sending an eviction hint to the Swift proxy which uses the Swift ring structure to identify the location of every other fragment of this object among the backend storage nodes to forward the eviction hint to each target node. Another embodiment uses one of the background consistency processes 226 (e.g., a Swift reconstructor) to pass the eviction hint from the object storage node to its closest two neighbors. This process repeats until all of the fragments for the given object are evicted. These two schemes may ensure that cache space is utilized efficiently in each of the nodes.

These schemes can be further improved using the principles of Erasure Coding. Namely, EC involves creating k data fragments which contain chunks of the original data and m code fragments which contain information to recreate the original data if one of the data fragments is lost, where k+m=n. First, caching hints are sent to all n nodes holding fragments (data or code) of the original data. This scheme aims to maximize performance. Second, caching hints are only sent to the k nodes holding data fragments. This allows for speedy retrieval of the data fragments to return the original data, while saving the cache space that would otherwise be used up to cache the m code fragments that are only required if one of the data fragments is lost (presumably not a common occurrence).

Furthermore, the decision for when to send eviction hints can similarly be modified depending on whether an operator/user prefers to aggressively clean up cache space (send hint when any fragment, code, or data, is evicted) or prefers to delay cleanup for potentially increasing the cache hits (send hint only when data fragment is evicted).

Additionally, referring to FIG. 2C, one might erroneously assume that simply deploying traditional LRU (Least Recently Used) caches on backend nodes should provide efficient caching of erasure coded data. For example, since consistent hashing distributes data equally amongst nodes, the EC fragments on each node would naturally enter the cache concurrently and also be evicted simultaneously. Per the below overview of a specific implementation of EC in Swift, it can be explained why LRU without any cluster-level coordination cannot utilize cache space effectively.

More particularly, on receiving an object to upload, the Swift Proxy first breaks the object into fixed sized 'segments'. Each segment is then Erasure Coded into a specified (via a policy) number of fragments, n. The Swift ring is then consulted to determine the target nodes for the given object URL (Uniform Resource Locator). The proxy stripes the fragments across the identified target nodes such that the n fragments for each segment are sent to the same n target nodes. As the fragments are received at the target object storage node, they are appended to a fragment archive, which is stored on the object storage node. This approach is taken to reduce the number of files to store on the storage media (there would be an object explosion if each fragment were treated as its own object).

A consequence of this approach of appending fragments into an archive for a given fragment index is that a really large object would result in larger fragment archives to be placed on the target nodes for the uploaded object. Since the consistent hashing is done at the object level, 'objects' are distributed equally amongst the storage nodes in the cluster, but a large object would cause more data to be stored on a subset of the nodes. Thus, if caches are deployed on each of the nodes, fragments of a given piece of data would be evicted from the caches at different times. In other words, without coordination, cache space would be wasted since only some fragments of an object would be retrieved from the cache, whereas the overall object reconstruction would be gated by the slower responding nodes that retrieve their respective fragments from the slower storage medium that backs the cache tier.

Figure 3:
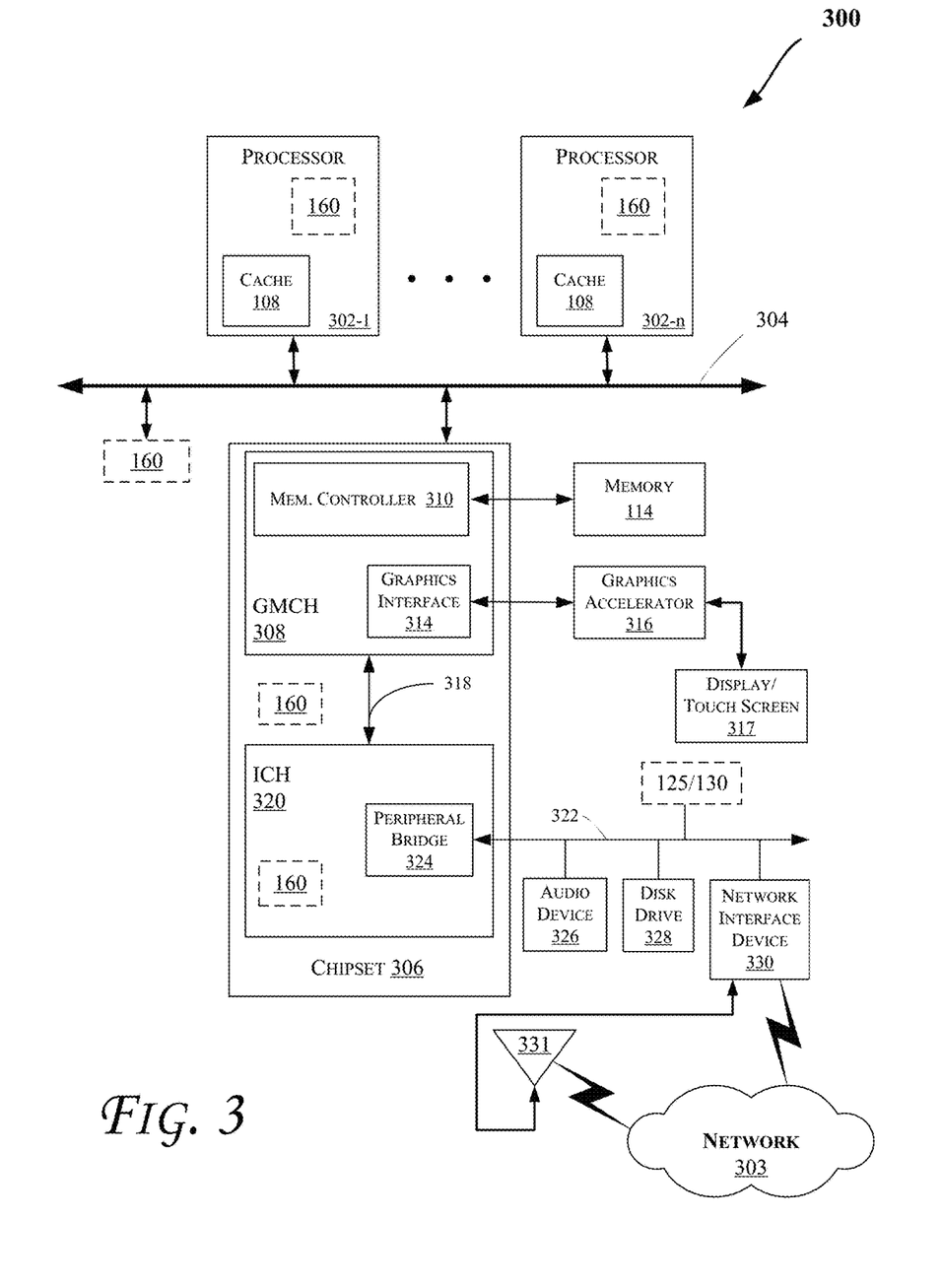

FIG. 3 illustrates a block diagram of a computing system 300 in accordance with an embodiment. The computing system 300 may include one or more central processing unit(s) (CPUs) 302 or processors that communicate via an interconnection network (or bus) 304. The processors 302 may include a general purpose processor, a network processor (that processes data communicated over a computer network 303), an application processor (such as those used in cell phones, smart phones, etc.), or other types of a processor (including a reduced instruction set computer (RISC) processor or a complex instruction set computer (CISC)).

Various types of computer networks 303 may be utilized including wired (e.g., Ethernet, Gigabit, Fiber, etc.) or wireless networks (such as cellular, including 3G (Third-Generation Cell-Phone Technology or 3rd Generation Wireless Format (UWCC)), 4G (Fourth-Generation Cell-Phone Technology), 4G Advanced, Low Power Embedded (LPE), Long Term Evolution (LTE), LTE advanced, etc.). Moreover, the processors 302 may have a single or multiple core design. The processors 302 with a multiple core design may integrate different types of processor cores on the same integrated circuit (IC) die. Also, the processors 302 with a multiple core design may be implemented as symmetrical or asymmetrical multiprocessors.

In an embodiment, one or more of the processors 302 may be the same or similar to the processors 102 of FIG. 1. For example, one or more of the processors 302 may include one or more of the cores 106 and/or processor cache 108. Also, the operations discussed with reference to FIGS. 1-2C may be performed by one or more components of the system 300.

A chipset 306 may also communicate with the interconnection network 304. The chipset 306 may include a graphics and memory control hub (GMCH) 308. The GMCH 308 may include a memory controller 310 (which may be the same or similar to the memory controller 120 of FIG. 1 in an embodiment) that communicates with the memory 114. The memory 114 may store data, including sequences of instructions that are executed by the CPU 302, or any other device included in the computing system 300. Also, system 300 includes logic 125/160 and/or NVM 130 in various locations such as shown or not shown. In one embodiment, the memory 114 may include one or more volatile memory devices such as random access memory (RAM), dynamic RAM (DRAM), synchronous DRAM (SDRAM), static RAM (SRAM), or other types of memory devices. Non-volatile memory may also be utilized such as a hard disk drive, flash, etc., including any NVM discussed herein. Additional devices may communicate via the interconnection network 304, such as multiple CPUs and/or multiple system memories.

The GMCH 308 may also include a graphics interface 314 that communicates with a graphics accelerator 316. In one embodiment, the graphics interface 314 may communicate with the graphics accelerator 316 via an accelerated graphics port (AGP) or Peripheral Component Interconnect (PCI) (or PCI express (PCIe) interface). In an embodiment, a display 317 (such as a flat panel display, touch screen, etc.) may communicate with the graphics interface 314 through, for example, a signal converter that translates a digital representation of an image stored in a memory device such as video memory or system memory into display signals that are interpreted and displayed by the display. The display signals produced by the display device may pass through various control devices before being interpreted by and subsequently displayed on the display 317.

A hub interface 318 may allow the GMCH 308 and an input/output control hub (ICH) 320 to communicate. The ICH 320 may provide an interface to I/O devices that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303, e.g., via a wired or wireless interface). As shown, the network interface device 330 may be coupled to an antenna 331 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 303. Other devices may communicate via the bus 322. Also, various components (such as the network interface device 330) may communicate with the GMCH 308 in some embodiments. In addition, the processor 302 and the GMCH 308 may be combined to form a single chip. Furthermore, the graphics accelerator 316 may be included within the GMCH 308 in other embodiments.

Furthermore, the computing system 300 may include volatile and/or nonvolatile memory. For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

FIG. 4 illustrates a computing system 400 that is arranged in a point-to-point (PtP) configuration, according to an embodiment. In particular, FIG. 4 shows a system where processors, memory, and input/output devices are interconnected by a number of point-to-point interfaces. The operations discussed with reference to FIGS. 1-3 may be performed by one or more components of the system 400.

As illustrated in FIG. 4, the system 400 may include several processors, of which only two, processors 402 and 404 are shown for clarity. The processors 402 and 404 may each include a local memory controller hub (MCH) 406 and 408 to enable communication with memories 410 and 412. The memories 410 and/or 412 may store various data such as those discussed with reference to the memory 114 of FIGS. 1 and/or 3. Also, MCH 406 and 408 may include the memory controller 120 in some embodiments. Furthermore, system 400 includes logic 125/160 and/or NVM 130 in various locations such as shown or not shown. The logic 125/160 and/or NVM 130 may be coupled to system 400 via bus 440 or 444, via other point-to-point connections to the processor(s) 402 or 404 or chipset 420, etc. in various embodiments.

In an embodiment, the processors 402 and 404 may be one of the processors 302 discussed with reference to FIG. 3. The processors 402 and 404 may exchange data via a point-to-point (PtP) interface 414 using PtP interface circuits 416 and 418, respectively. Also, the processors 402 and 404 may each exchange data with a chipset 420 via individual PtP interfaces 422 and 424 using point-to-point interface circuits 426, 428, 430, and 432. The chipset 420 may further exchange data with a high-performance graphics circuit 434 via a high-performance graphics interface 436, e.g., using a PtP interface circuit 437. As discussed with reference to FIG. 3, the graphics interface 436 may be coupled to a display device (e.g., display 317) in some embodiments.

In one embodiment, one or more of the cores 106 and/or processor cache 108 of FIG. 1 may be located within the processors 402 and 404 (not shown). Other embodiments, however, may exist in other circuits, logic units, or devices within the system 400 of FIG. 4. Furthermore, other embodiments may be distributed throughout several circuits, logic units, or devices illustrated in FIG. 4.

The chipset 420 may communicate with a bus 440 using a PtP interface circuit 441. The bus 440 may have one or more devices that communicate with it, such as a bus bridge 442 and I/O devices 443. Via a bus 444, the bus bridge 442 may communicate with other devices such as a keyboard/mouse 445, communication devices 446 (such as modems, network interface devices, or other communication devices that may communicate with the computer network 303, as discussed with reference to network interface device 330 for example, including via antenna 331), audio I/O device, and/or a data storage device 448. The data storage device 448 may store code 449 that may be executed by the processors 402 and/or 404.

In some embodiments, one or more of the components discussed herein can be embodied as a System On Chip (SOC) device. FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged onto a single semiconductor device.

As illustrated in FIG. 5, SOC package 502 is coupled to a memory 560 (which may be similar to or the same as memory discussed herein with reference to the other figures) via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like. Furthermore, SOC package 502 may include/integrate items 125, 130, and/or 160 in an embodiment. Alternatively, items 125, 130, and/or 160 may be provided outside of the SOC package 502 (i.e., as a discrete logic).

Embodiments described herein can be powered by a battery, wireless charging, a renewal energy source (e.g., solar power or motion-based charging), or when connected to a charging port or wall outlet.

The following examples pertain to further embodiments. Example 1 may optionally include an apparatus comprising: logic to generate a plurality of fragments of a data object to be Erasure Coded (EC) prior to storage at a storage node of a plurality of storage nodes, wherein each of the plurality of fragments is to be transmitted with a caching hint to indicate whether that fragment is to be cached at the storage node. Example 2 may optionally include the apparatus of example 1, comprising logic to determine whether to cache the plurality of fragments based at least in part on one or more of: a size of the data object, a source of the data object, and a destination of the data object. Example 3 may optionally include the apparatus of example 1, comprising logic to determine where to store an EC fragment in a storage hierarchy of the storage node based at least in part on the caching hint. Example 4 may optionally include the apparatus of example 1, comprising logic to pass an eviction hint from the storage node to one or more neighboring storage nodes. Example 5 may optionally include the apparatus of example 1, wherein the logic is to pass an eviction hint to all storage that store the plurality of fragments. Example 6 may optionally include the apparatus of example 1, wherein the storage node is to comprise the logic. Example 7 may optionally include the apparatus of example 1, comprising logic to extract the caching hint and to add the caching hint to a write operation to a memory coupled to the storage node. Example 8 may optionally include the apparatus of example 1, wherein the plurality of storage nodes is to comprise a near storage node and/or a far storage node. Example 9 may optionally include the apparatus of example 1, wherein the plurality of storage nodes is to communicate via a network. Example 10 may optionally include the apparatus of example 9, wherein the network is to comprise a wired and/or a wireless network. Example 11 may optionally include the apparatus of example 1, wherein each of the plurality of storage nodes is to comprise one or more of: a hard disk drive, a solid state drive, and a hybrid drive. Example 12 may optionally include the apparatus of example 1, wherein each of the plurality of storage nodes is to comprise volatile memory and/or non-volatile memory. Example 13 may optionally include the apparatus of example 12, wherein the non-volatile memory is to comprise one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption. Example 14 may optionally include the apparatus of example 1, further comprising one or more of: at least one processor, having one or more processor cores, communicatively coupled to the storage node, a battery communicatively coupled to the apparatus, or a network interface communicatively coupled to the apparatus.

Example 15 may optionally include a method comprising: generating a plurality of fragments of a data object to be Erasure Coded (EC) prior to storage at a storage node of a plurality of storage nodes, wherein each of the plurality of fragments is transmitted with a caching hint to indicate whether that fragment is to be cached at the storage node. Example 16 may optionally include the method of example 15, further comprising determining whether to cache the plurality of fragments based at least in part on one or more of: a size of the data object, a source of the data object, and a destination of the data object. Example 17 may optionally include the method of example 15, further comprising determining where to store an EC fragment in a storage hierarchy of the storage node based at least in part on the caching hint. Example 18 may optionally include the method of example 15, further comprising passing an eviction hint from the storage node to one or more neighboring storage nodes. Example 19 may optionally include the method of example 15, further comprising extracting the caching hint and to add the caching hint to a write operation to a memory coupled to the storage node. Example 20 may optionally include the method of example 15, further comprising the plurality of storage nodes communicating via a network.

Example 21 may optionally include one or more computer-readable medium comprising one or more instructions that when executed on at least one processor configure the at least one processor to perform one or more operations to: generate a plurality of fragments of a data object to be Erasure Coded (EC) prior to storage at a storage node of a plurality of storage nodes, wherein each of the plurality of fragments is to be transmitted with a caching hint to indicate whether that fragment is to be cached at the storage node. Example 22 may optionally include the one or more computer-readable medium of example 21, further comprising one or more instructions that when executed on the processor configure the processor to perform one or more operations to determine whether to cache the plurality of fragments based at least in part on one or more of: a size of the data object, a source of the data object, and a destination of the data object. Example 23 may optionally include the one or more computer-readable medium of example 21, further comprising one or more instructions that when executed on the processor configure the processor to perform one or more operations to determine where to store an EC fragment in a storage hierarchy of the storage node based at least in part on the caching hint. Example 24 may optionally include the one or more computer-readable medium of example 21, further comprising one or more instructions that when executed on the processor configure the processor to perform one or more operations to pass an eviction hint from the storage node to one or more neighboring storage nodes.

Example 25 may optionally include a computing system comprising: a processor; memory, coupled to the processor, to store data corresponding to object stores; and logic to generate a plurality of fragments of a data object to be Erasure Coded (EC) prior to storage at a storage node of a plurality of storage nodes, wherein each of the plurality of fragments is to be transmitted with a caching hint to indicate whether that fragment is to be cached at the storage node. Example 26 may optionally include the system of example 25, comprising logic to determine whether to cache the plurality of fragments based at least in part on one or more of: a size of the data object, a source of the data object, and a destination of the data object. Example 27 may optionally include the system of example 25, comprising logic to determine where to store an EC fragment in a storage hierarchy of the storage node based at least in part on the caching hint. Example 28 may optionally include the system of example 25, comprising logic to pass an eviction hint from the storage node to one or more neighboring storage nodes. Example 29 may optionally include the system of example 25, wherein the logic is to pass an eviction hint to all storage that store the plurality of fragments. Example 30 may optionally include the system of example 25, wherein the storage node is to comprise the logic. Example 31 may optionally include the system of example 25, comprising logic to extract the caching hint and to add the caching hint to a write operation to the memory coupled to the storage node. Example 32 may optionally include the system of example 25, wherein the plurality of storage nodes is to comprise a near storage node and/or a far storage node. Example 33 may optionally include the system of example 25, wherein the plurality of storage nodes is to communicate via a network. Example 34 may optionally include the system of example 25, wherein each of the plurality of storage nodes is to comprise one or more of: a hard disk drive, a solid state drive, and a hybrid drive. Example 35 may optionally include the system of example 25, wherein each of the plurality of storage nodes is to comprise volatile memory and/or non-volatile memory. Example 36 may optionally include the system of example 25, further comprising one or more of: the processor, having one or more processor cores, communicatively coupled to the storage node, a battery communicatively coupled to the apparatus, or a network interface communicatively coupled to the apparatus.

Example 37 may optionally include an apparatus comprising means to perform a method as set forth in any preceding example. Example 38 comprises machine-readable storage including machine-readable instructions, when executed, to implement a method or realize an apparatus as set forth in any preceding example.

In various embodiments, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a memory device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features, numerical values, and/or methodological acts, it is to be understood that claimed subject matter may not be limited to the specific features, numerical values, or acts described. Rather, the specific features, numerical values, and acts are disclosed as sample forms of implementing the claimed subject matter.

The invention claimed is:

1. An apparatus comprising:
   logic to generate a plurality of fragments of a data object to be Erasure Coded (EC) prior to storage at a storage node of a plurality of storage nodes,
   wherein each of the plurality of fragments is to be transmitted with a caching hint to indicate whether that fragment is to be cached at the storage node, wherein a determination of whether to cache all of the plurality of fragments is to be based at least in part on: a source of the data object, a destination of the data object, and a size-range based policy.

2. The apparatus of claim 1, comprising logic to determine where to store an EC fragment in a storage hierarchy of the storage node based at least in part on the caching hint.

3. The apparatus of claim 1, comprising logic to pass an eviction hint from the storage node to one or more neighboring storage nodes.

4. The apparatus of claim 1, wherein the logic is to pass an eviction hint to all storage that store the plurality of fragments.

5. The apparatus of claim 1, wherein the storage node is to comprise the logic.

6. The apparatus of claim 1, comprising logic to extract the caching hint and to add the caching hint to a write operation to a memory coupled to the storage node.

7. The apparatus of claim 1, wherein the plurality of storage nodes is to comprise a near storage node and/or a far storage node.

8. The apparatus of claim 1, wherein the plurality of storage nodes is to communicate via a network.

9. The apparatus of claim 8, wherein the network is to comprise a wired and/or a wireless network.

10. The apparatus of claim 1, wherein each of the plurality of storage nodes is to comprise one or more of: a hard disk drive, a solid state drive, and a hybrid drive.

11. The apparatus of claim 1, wherein each of the plurality of storage nodes is to comprise volatile memory and/or non-volatile memory.

12. The apparatus of claim 11, wherein the non-volatile memory is to comprise one or more of: nanowire memory, Ferro-electric Transistor Random Access Memory (FeTRAM), Magnetoresistive Random Access Memory (MRAM), flash memory, Spin Torque Transfer Random Access Memory (STTRAM), Resistive Random Access Memory, byte addressable 3-Dimensional Cross Point Memory, PCM (Phase Change Memory), write-in-place non-volatile memory, and volatile memory backed by a power reserve to retain data during power failure or power disruption.

13. The apparatus of claim 1, further comprising one or more of: at least one processor, having one or more processor cores, communicatively coupled to the storage node, a battery communicatively coupled to the apparatus, or a network interface communicatively coupled to the apparatus.

14. The apparatus of claim 1, wherein the size-range based policy is to indicate that all fragments of objects whose size falls in a size range are to be cached at the storage node.

15. The apparatus of claim 1, wherein the caching hint is to be generated by a storage middleware logic.

16. A method comprising:
generating a plurality of fragments of a data object to be Erasure Coded (EC) prior to storage at a storage node of a plurality of storage nodes,
wherein each of the plurality of fragments is transmitted with a caching hint to indicate whether that fragment is to be cached at the storage node, wherein a determination of whether to cache all of the plurality of fragments is based at least in part on: a source of the data object, a destination of the data object, and a size-range based policy.

17. The method of claim 16, further comprising determining where to store an EC fragment in a storage hierarchy of the storage node based at least in part on the caching hint.

18. The method of claim 16, further comprising passing an eviction hint from the storage node to one or more neighboring storage nodes.

19. The method of claim 16, further comprising extracting the caching hint and to add the caching hint to a write operation to a memory coupled to the storage node.

20. The method of claim 16, further comprising the plurality of storage nodes communicating via a network.

21. The method of claim 16, further comprising generating the caching hint at a storage middleware logic.

22. One or more non-transitory computer-readable medium comprising one or more instructions that when executed on at least one processor configure the at least one processor to perform one or more operations to:
generate a plurality of fragments of a data object to be Erasure Coded (EC) prior to storage at a storage node of a plurality of storage nodes,
wherein each of the plurality of fragments is to be transmitted with a caching hint to indicate whether that fragment is to be cached at the storage node, wherein a determination of whether to cache all of the plurality of fragments is to be based at least in part on: a source of the data object, a destination of the data object, and a size-range based policy.

23. The one or more non-transitory computer-readable medium of claim 22, further comprising one or more instructions that when executed on the processor configure the processor to perform one or more operations to determine where to store an EC fragment in a storage hierarchy of the storage node based at least in part on the caching hint.

24. The one or more non-transitory computer-readable medium of claim 22, further comprising one or more instructions that when executed on the processor configure the processor to perform one or more operations to pass an eviction hint from the storage node to one or more neighboring storage nodes.

25. The one or more non-transitory computer-readable medium of claim 22, further comprising one or more instructions that when executed on the processor configure the processor to perform one or more operations to generate the caching hint at a storage middleware logic.

* * * * *